(12) United States Patent
Kang et al.

(10) Patent No.: US 12,735,806 B2
(45) Date of Patent: Sep. 15, 2026

(54) METHOD FOR SIC STEP FLOW GROWTH BY REGULATING GROWTH MONMOERS USING CHEMICAL POTENTIAL UNDER NON-EQUILIBRIUM CONDITION

(71) Applicant: Xiamen University, Xiamen (CN)

(72) Inventors: Junyong Kang, Xiamen (CN); Wei Lin, Xiamen (CN); Wenyu Kang, Xiamen (CN); Haonan Chen, Xiamen (CN); Xinlu Chen, Xiamen (CN)

(73) Assignee: Xiamen University, Xiamen (CN)

( * ) Notice: Subject to any disclaimer, the term of this patent is extended or adjusted under 35 U.S.C. 154(b) by 291 days.

(21) Appl. No.: 18/440,873

(22) Filed: Feb. 13, 2024

(65) Prior Publication Data

US 2024/0183063 A1 Jun. 6, 2024

Related U.S. Application Data

(63) Continuation of application No. PCT/CN2022/104836, filed on Jul. 11, 2022.

(30) Foreign Application Priority Data

Aug. 13, 2021 (CN) ......................... 202110931253.0

(51) Int. Cl.
*C30B 25/16* (2006.01)
*C30B 25/18* (2006.01)
(Continued)

(52) U.S. Cl.
CPC ............ *C30B 25/16* (2013.01); *C30B 25/186* (2013.01); *C30B 25/20* (2013.01); *C30B 29/36* (2013.01);
(Continued)

(58) Field of Classification Search
CPC ....... C30B 25/16; C30B 25/186; C30B 25/20; C30B 29/36; H10P 14/20; H10P 14/2904; H10P 14/3408; H10P 14/24
See application file for complete search history.

(56) References Cited

U.S. PATENT DOCUMENTS 5,719,410 A * 2/1998 Suehiro ............ H10D 64/01312 257/77
6,133,120 A * 10/2000 Miyajima ............ H10D 30/668 257/E29.104
2011/0045281 A1 2/2011 Myers-Ward et al.

FOREIGN PATENT DOCUMENTS

CN 1956213 A 5/2007
CN 112701031 A 4/2021
(Continued)

OTHER PUBLICATIONS

Corresponding International Patent Application No. PCT/CN2022/104836, International Search Report, date mailed Oct. 9, 2022.
(Continued)

*Primary Examiner* — Robert M Kunemund
(74) *Attorney, Agent, or Firm* — Cooper Legal Group, LLC

(57) ABSTRACT

A method for SiC high-speed growth by regulating growth monomers using chemical potential under a non-equilibrium condition. The method uses a C-rich process ($Si/H_2$=0.97‰, C/Si=1.55) to achieve a rapid growth of an epitaxial layer. When a relative chemical potential $\mu_C$ of the C source in a growth atmosphere is high, growth monomers adsorbed in advance are SiC molecules in an epitaxial growth, and a height of a growth step is maintained at ½ c or 1 c. A rapid growth of the epitaxial growth is achieved, and a better surface roughness and a lower ionized doping concentration are obtained at the same time.

13 Claims, 2 Drawing Sheets

(51) Int. Cl.

| | |
|---|---|
| ***C30B 25/20*** | (2006.01) |
| ***C30B 29/36*** | (2006.01) |
| ***H10P 14/20*** | (2026.01) |
| ***H10P 14/24*** | (2026.01) |

(52) U.S. Cl.
CPC .............. *H10P 14/20* (2026.01); *H10P 14/24* (2026.01); *H10P 14/2904* (2026.01); *H10P 14/3408* (2026.01)

(56) References Cited

FOREIGN PATENT DOCUMENTS

| | | | | |
|---|---|---|---|---|
| CN | 113227465 A | | 8/2021 | |
| CN | 113668052 A | | 11/2021 | |
| JP | 4585137 B2 | * | 11/2010 | |
| WO | WO-2016052114 A1 | * | 4/2016 | .............. F01D 5/28 |
| WO | 2020095873 A | | 5/2020 | |

OTHER PUBLICATIONS

Corresponding International Patent Application No. PCT/CN2022/104836, Written Opinion, date mailed Oct. 9, 2022.

Dong, Lin, et al., "Growth of 4H—SiC epilayers with low surface roughness and morphological defects density on 4° off-axis substrates", Applied Surface Science, Jan. 11, 2013, pp. 301-306, vol. 270.

Li, Yun, et al., "Influence of Flow Rate on Epitaxial Growth of SiC", Semiconductor Technology, Dec. 2008, vol. 33, pp. 266-268, with English abstract.

Corresponding Chinese Patent Application No. 202110931253.0, First Office Action dated Mar. 24, 2022.

Corresponding Chinese Patent Application No. 202110931253.0, Notification of Grant of Patent dated Sep. 5, 2022.

Zhao, Lixia,et al. "A correlation study of substrate and epitaxial wafer with 4H-N type silicon carbide", Journal of Crystal Growth, 2019, pp. 109-112, vol. 57.

Sun, Yongqiang, et al., "Analysis and Reduction of Obtuse Triangular Defects on 150-mm 4° 4H—SiC Epitaxial Wafers", Journal of Electronic Materials, Jun. 30, 2018, pp. 5109-5112, vol. 4.

Sun, Yongqiang, et al., "Formation and Reduction of Large Growth Pits on 100 mm 4° 4H—SiC", Materials Science Forum, May 24, 2016, pp. 193-196, vol. 858.

Zhao, L. X., et al., "High quality 4H—SiC homo-epitaxial wafer using the optimal C/Si ratio", Journal of Crystal Growth, 2020, pp. 1-4, vol. 530.

* cited by examiner (a) $Si/H_2$=0.97‰, C/Si = 1.25, EDD = 1.33 $cm^{-2}$, RMS = 0.31 nm, hight of growth step 1/2c (b) $Si/H_2$=0.97‰, C/Si = 1.55, EDD = 0.59 $cm^{-2}$, RMS = 0.41 nm, hight of growth step 1/2c (c) $Si/H_2$=0.97‰, C/Si = 1.75, EDD = 1.22 $cm^{-2}$, RMS = 0.68 nm,hight of growth step 1/2c和1c

METHOD FOR SIC STEP FLOW GROWTH BY REGULATING GROWTH MONMOERS USING CHEMICAL POTENTIAL UNDER NON-EQUILIBRIUM CONDITION

RELATED APPLICATIONS

This application is a continuation of International patent application PCT/CN2022/104836, filed on Jul. 11, 2022, which claims priority to Chinese patent application 202110931253.0, filed on Aug. 13, 2021. International patent application PCT/CN2022/104836 and Chinese patent application 202110931253.0 are incorporated herein by reference.

FIELD OF THE DISCLOSURE

The present disclosure relates to a method for SiC step flow growth by regulating growth monomers using chemical potential under a non-equilibrium condition.

BACKGROUND OF THE DISCLOSURE

With urgent requirements of high-temperature, high-power, high-voltage, and radiation-resistant electronic devices in the fields of power transmission, power conversion, aerospace, military, nuclear energy, etc., wide-bandwidth compound semiconductor materials, represented by silicon carbide (SiC), GaN, ZnO, etc., have gradually attracted attention from people. SiC materials have the advantages of wide bandwidth, high thermal conductivity, high breakdown field strength, high saturation electron drift velocity, etc.

As the cost of SiC power devices is still at a disadvantage compared with a same type of Si-based devices, a wafer size needs to be increased to reduce the cost of the SiC power devices. Statistics from the YOLE group (French) show that the cost of 150 mm 4H—SiC 1200V/20 A metal-oxide semiconductor field effect transistor (MOSFET) devices is reduced 45% compared with a 100 mm 4H—SiC device having a same specification. Therefore, obtaining large-size high-quality 4H—SiC thick film epitaxial wafers to reduce the cost of the SiC power devices and to expand an application of the SiC power devices in the high-voltage and high-power field so as to develop the SiC industry are becoming extremely important.

The currently known SiC power materials have nearly 250 polycrystalline types with different periodic arrangements thereof, and structural characteristics of the polycrystalline types have brought great difficulties in crystal growth. The most common crystal structures are 3C—SiC, 4H—SiC, and 6H—SiC, the 4H—SiC is one of the SiC semiconductor materials most widely researched and applied. A forbidden band width of the 4H—SiC is higher, an electron mobility of the 4H—SiC is twice as much as that of the 6H—SiC, and the 4H—SiC is very suitable for preparing high-voltage high-power power electronic devices. Currently, common SiC epitaxy methods mainly comprise Chemical Vapor Phase Epitaxy (CVPE), Liquid Phase Epitaxy (LPE), Sublimation Epitaxy (PVT), and Molecular Beam Epitaxy (MBE), and each of the common SiC epitaxy methods has advantages.

Compared to other epitaxy methods, chemical vapor deposition (CVD) involves performing a chemical reaction by introducing a source gas into a reaction chamber, and finally epitaxially growing an SiC layer on a substrate surface. A doping concentration can be better controlled by adjusting a C/Si ratio and a nitrogen doping amount. A growth speed can be effectively improved so as to improve a growth efficiency by increasing a flow amount of the source gas, lowering a pressure inside the reaction chamber, etc. A surface defect distribution and a thickness uniformity of an epitaxial layer can be improved by adjusting a flow amount and a ratio of a carrier gas, a growth temperature, and other parameters. CVD is very suitable for batch production of SiC epitaxy and has become the most popular 4H—SiC epitaxy method.

SiC crystals are prone to form defects and even polycrystalline inclusions occur during a growth process due to extremely low formation power of stacking faults (SFs). Common defects in 4H—SiC crystal growth include: polycrystalline mixing, carbon inclusions, the stacking faults, micropipes (MPs), threading screw dislocation (TSD), threading edge dislocations (TED), and basal plane dislocation (BPD). Dislocation defects within the 4H—SiC substrate will gradually extend into a crystal with a growth of bulk crystals and cannot be totally removed by a processing method, so a growth of a high-quality 4H—SiC homogeneous epitaxial layer is a basis for preparing 4H—SiC power electronic devices. Compared with the traditional silicon materials, the 4H—SiC material has difficulty in doping by diffusing due to stability of physical and chemical properties, the 4H—SiC substrate material cannot be directly used for device preparation, and a material structure required for the device preparation needs to be complete by the epitaxial growth.

With respect to the 4H—SiC epitaxial growth, a difference of formation energy of each stacking layer is small due to layers of a C—Si biatomic layer interacting with each other by van der Waals force. A slight perturbation during the growth process can lead to stacking order variation and incurring stacking fault defects or generating other crystalline types. The common 4H—SiC epitaxial defects include dropouts, triangle defects, carrot dislocations, microtubules, and dislocations. Large-size 4H—SiC thick-film low-doping epitaxial growth has the following problems: (1) 4H—SiC thick-film epitaxy usually uses a high-speed growth process prone to form step aggregation and a fundamental theoretical research according to a mechanism of step growth is lacking, and (2) with a size of the 4H—SiC wafer expanding to 150 mm, growth atmosphere of different regions of the wafer surface during the epitaxial growth greatly differs from the traditional 100 mm epitaxy radial due to increased difference of exhausting of the source gas in a radial direction, a thickness inside the 4H—SiC wafer and doping concentration distribution uniformity are difficult to ensure, the high-voltage high-power devices not only need a thicker epitaxial layer, but an extremely low doping concentration is also needed, and a difficulty of an epitaxial process is greater. Growing a thicker epitaxial layer at a low speed results in lower productivity and significantly increased costs. It is also necessary to provide a high growth rate or a short cycle to increase a yield in a production of the epitaxial layer.

The 4H—SiC thick-film epitaxy usually uses a high-speed growth process prone to form the step aggregation, and effective guidance according to the mechanism of the step growth is lacking. Therefore, seeking a technology to produce the large-size 4H—SiC epitaxial layer with sufficient uniformity and low defect density in a short cycle is a current issue in the industry.

BRIEF SUMMARY OF THE DISCLOSURE

The present disclosure provides a method for SiC step flow growth by regulating growth monomers using chemical potential under a non-equilibrium condition to solve the aforementioned technical problem.

A technical solution of the present disclosure to solve the aforementioned technical problem is as follows:

A method for SiC step flow growth by regulating growth monomers using chemical potential under a non-equilibrium condition, comprising:

1) preparing a silicon carbide (SiC) substrate, wherein the SiC substrate is a 4H—SiC substrate with a step;
2) heating a reaction chamber to a first temperature, and then maintaining the reaction chamber at the first temperature;
3) placing the 4H—SiC substrate with the step into a susceptor, and then loading the susceptor and the 4H—SiC substrate with the step into the reaction chamber together while maintaining a temperature of the reaction chamber at the first temperature;
4) heating the reaction chamber to a preset process temperature, and reducing a pressure of the reaction chamber to a preset growth pressure at a same time;
5) performing in-situ etching on the 4H—SiC substrate with the step while maintaining at the preset process temperature when the temperature of the reaction chamber reaches the preset process temperature;
6) filling a growth source gas after the in-situ etching is complete, and growing an epitaxial layer under a C-rich condition to obtain an epitaxial substrate, wherein growing the epitaxial layer under the C-rich condition comprises controlling chemical potential $\mu_C$ of C to vary in a range of from $\Delta H_f^{SiC}+\mu_C^{bulk}=-9.643384$ eV to $\mu_C^{bulk}=-9.095729$ eV, $\mu_C^{bulk}$ is chemical potential of C single-crystal diamond, and $\Delta H_f^{SiC}$ is formation enthalpy of SiC;
7) turning off the growth source gas and cooling after growing the epitaxial layer is complete, and then taking the susceptor and the epitaxial substrate out of the reaction chamber.

In a preferred embodiment, the step 6 comprises: controlling the chemical potential $\mu_C$ of C, wherein $\mu_C$ is greater than −9.300000 eV, $\mu_C$ is less than $\mu_C^{bulk}$, and the $\mu_C^{bulk}$ is −9.095729 eV.

In a preferred embodiment, in the step 6, flow amounts of a C source and an Si source are $Si/H_2$=0.97‰ and C/Si=1.55, a growth speed of 30 μm/hour is achieved in the C-rich condition, and a height of step growth to be ½ c.

In a preferred embodiment, in the step 6, a temperature for growing the epitaxial layer is 1500-1700° C., and a growth pressure for growing the epitaxial layer is 80-150 mbar.

In a preferred embodiment, in the step 6, the growth source gas comprises at least one of $SiH_4$, TCS, $C_3H_8$, or $C_2H_4$.

In a preferred embodiment, in the step 2, the first temperature is 850-950° C.

In a preferred embodiment, the heating the reaction chamber to the preset process temperature in step 4 comprises: firstly heating to 1400° C. at a speed of 20-30° C./minute, and then heating to the preset process temperature at a speed of 10-15° C./minute.

In a preferred embodiment, the preset process temperature in step 4 is 1550-1670° C.

In a preferred embodiment, pure hydrogen or pure hydrogen mixed with the growth source gas is used during the in-situ etching of the step 5, and the in-situ etching is performed for 1-20 minutes.

In a preferred embodiment, the cooling in the step 7 comprises naturally cooling to the first temperature.

Compared with the background, the method of the present disclosure has the following advantages:

1. SiC without dislocations can be obtained;
2. The method uses a C-rich process ($Si/H_2$=0.97‰, C/Si=1.55) to achieve a rapid growth of an epitaxial layer. When a relative chemical potential $\mu_C$ of the C source in a growth atmosphere is high, growth monomers adsorbed in advance are SiC molecules in an epitaxial growth, and a height of a growth step is maintained at ½ c or 1 c. A rapid growth of the epitaxial growth is achieved, and a better surface roughness and a lower ionized doping concentration are obtained at the same time; and
3. Advantages for growing the epitaxial layer under a high-speed C-rich condition are as follows:

(1) A growth speed is faster (30 μm/hour) and can meet growth needs of thick-film epitaxy. At the same time, adsorbed units that participated in growth in advance are SiC molecules, and a height of a growth step is ½ c. Although a growth environment is in a C-rich condition, high step aggregation will not occur on an epitaxial surface and a roughness is better as long as chemical potential of a C source is maintained to be relatively low;
(2) According to "competing position principle", relative chemical potential of the C source in the growth atmosphere is high and N atoms have difficulty entering into crystal lattices, so doping can be performed using low doping modulation according to needs of the devices; and
(3) In a C-rich growth condition, a lateral growth speed on a step surface is higher than a step growth speed to enable BPD defects to be transformed into TED under image force, and transformation efficiency of BPD defects can be increased.

BRIEF DESCRIPTION OF THE DRAWING

The present disclosure will be further described in combination with the accompanying drawings and embodiments.

DETAILED DESCRIPTION OF THE EMBODIMENTS

Figure 1:
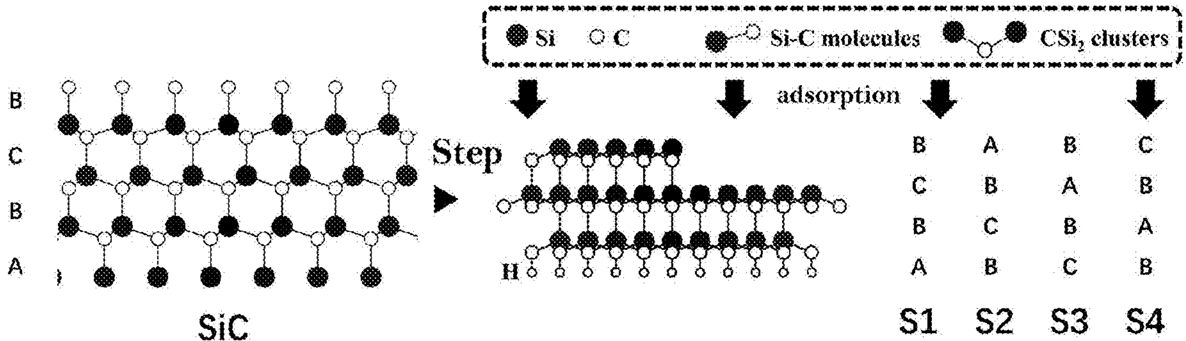
FIG. 1 shows a step surface model.

A method for SiC high-speed growth by regulating growth monomers using chemical potential under a non-equilibrium condition comprises following steps:

Preparing a 4H-silicon carbide (SiC) substrate: the 4H—SiC substrate is SiC with a step.

Heating: radio frequency (RF) heating is used, a reaction chamber is heated from room temperature (20° C.) to 900° C. and maintained at a constant temperature of 900° C.

Putting the 4H—SiC substrate at the constant temperature 900° C. into a susceptor: the 4H—SiC substrate for growth is placed into the susceptor using a vacuum pen. The susceptor and the 4H—SiC substrate are then loaded into a reaction chamber by a manipulator, and a temperature of the reaction chamber is maintained at 900° C. at this time.

Heating up to a preset process temperature (1550-1670° C.): the reaction chamber is heated by a RF generator according to a preset heating speed. At the same time, a pressure of the reaction chamber gradually decreases to a preset growth pressure.

In-situ etching: when the temperature of the reaction chamber reaches the preset process temperature, the in-situ etching of the 4H—SiC substrate is preformed while being maintained at the preset process temperature for 1-20 minutes.

A growth of 4H—SiC is performed by regulating chemical potential, wherein the regulating chemical potential is discriminated based on the following formula:

$$\Delta G_f = E_{tot} - E_{ref} - \Delta n_{Si}\mu_{Si} - \Delta n_C\mu_C \quad (1.1)$$

$G_f$ denotes variation amounts of formation power of an adsorption model of various growth monomers on a clean step surface of the step relative to the clean step surface, $E_{tot}$ denotes a total energy of a system of atoms, molecules, or clusters adsorbed by the step, $E_{ref}$ denotes a total energy of the clean step surface, $\mu_{Si}$ and $\mu_C$ respectively denote chemical potentials of elements Si and C, and $\Delta n_{Si}$ and $\Delta n_C$ respectively denote variation amounts of Si and C atoms in the various growth monomers (i.e., various growth structures) relative to the clean step surface. In an equilibrium condition, chemical potentials of a specified specie in all associated phases are equal. Assuming that various step surfaces and body structures of the 4H—SiC are in equilibrium, chemical potentials of the elements Si and C are therefore linked according to an equation $\mu_{Si}+\mu_C=\mu_{SiC}^{bulk}$ instead of being independent from each other, wherein $\mu_{SiC}^{bulk}$ denotes chemical potential of 4H—SiC crystal. The formation power of the various grown structures relative to the clean step surface can be then expressed as a formula related to atomic chemical potential, and the formula (1.1) can be described as follows:

$$\Delta G_f = E_{tot} - E_{ref} - \Delta n_{Si}\mu_{SiC}^{bulk} + (\Delta n_C - \Delta n_{Si}) \quad (1.2)$$

In actual growth of SiC materials, in order to avoid forming a simple substance, such as single-crystal Si or diamond C which have difficulties forming the 4H—SiC, chemical potentials of various atoms should satisfy the following formula:

$$\Delta H_f^{SiC} + \mu_C^{bulk} \le \mu_C \le \mu_C^{bulk}, \quad (1.3)$$

Figure 2:
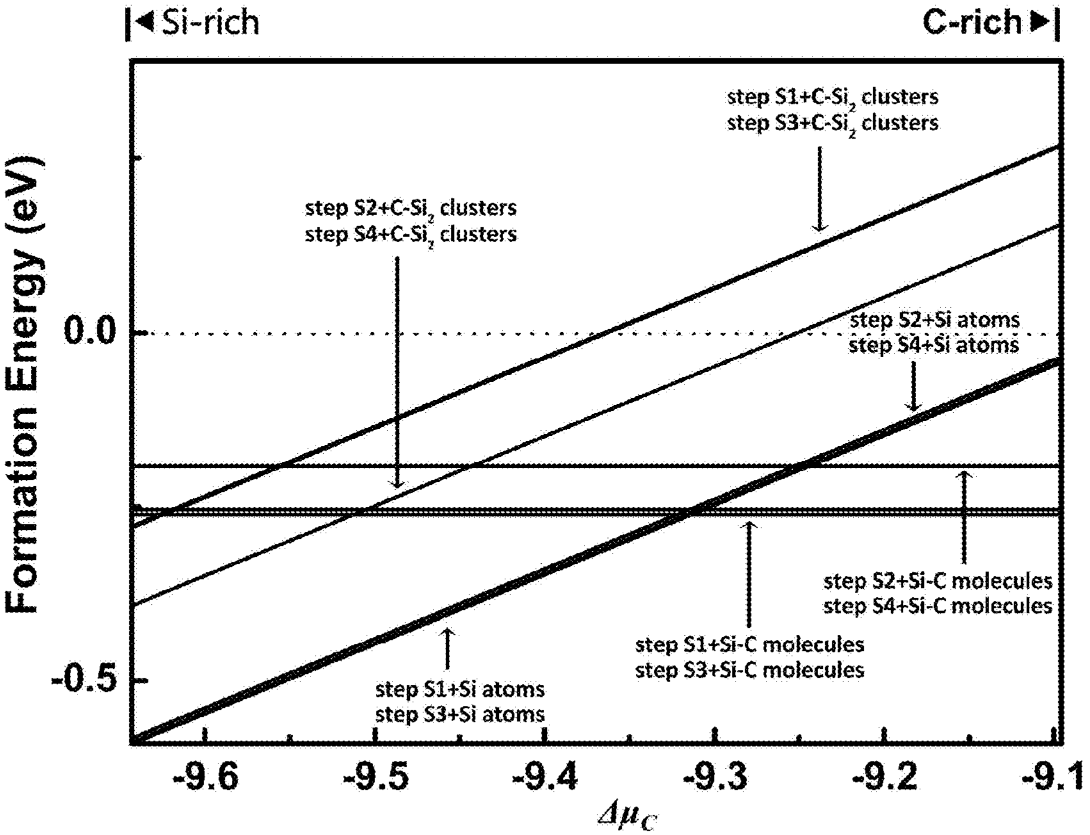
FIG. 2 shows of dependence plots of formation power of $Si_mC_n$ adsorbed on a surface following with Si chemical potential.

$\Delta H_f^{SiC}$ is formation enthalpy of SiC, $\mu_C^{bulk}$ is chemical potential of C single-crystal diamond, and chemical potential $\mu_C$ of C varies in a range from $\Delta H_f^{SiC}+\mu_C^{bulk}=-9.643384$ eV (Si rich condition) to $\mu_C^{bulk}=-9.095729$ eV (a C rich condition). A variation trend of formation power and the chemical potential $\mu_C$ of C of various adsorption structures is plotted based on the formula (1.1), as shown in FIG. 2. When $\mu_C$ is greater than −9.300000 eV, growth environment gradually trends to the C rich condition, and a stability of SiC molecules adsorbed on a boundary of a ¼ c step is highest, followed by Si atoms. At this time, no adsorption of C—$Si_2$ clusters will occur. In this state, formation power of SiC molecules adsorbed on various step surfaces has the following relationships: formation power of four adsorption structures is similar two by two, formation powers of S1+SiC and S3+SiC are lower than formation powers of S2+SiC and S4+SiC, growth speeds of steps S1 and S3 are faster so as to easily catch up with growth speeds of steps S2 and S4, and a double-step growth mode is formed. At this time, a height of a growth step is ½ c (half of a crystalline cell height of the 4H—SiC).

According to the aforementioned principle, a ratio of C and Si in growth atmosphere is adjusted to create the C-rich condition for a rapid growth of the 4H—SiC. After in-situ etching is complete, source gases are filled, and growth is performed under a C-rich condition (a flow amount of an Si source is selected as follows: Si/$H_2$=0.97‰, C/Si=1.55, and a growth speed is about 30 μm/hour). A silicon source $SiHCl_3$ (TCS), a carbon source $C_2H_4$, and a doping gas source $N_2$ are introduced according to a preset flow rate and are maintained for a preset growth time, and epitaxial growth of the 4H—SiC with a specified thickness is complete to obtain an epitaxial 4H—SiC substrate.

Finally, cooling and removing the epitaxial 4H—SiC substrate: after the epitaxial growth is complete, the source gases are turned off, and the RF source is turned off and directly cooled. When the temperature reaches 900° C., the RF source will be turned on again to enable the temperature to be constantly maintained at 900° C. At the same time, the manipulator will take the susceptor and the epitaxial 4H—SiC substrate out of the reaction chamber.

In a preferred embodiment of the present disclosure, the step of the 4H—SiC substrate is a C—Si biatomic layer with one side of an uppermost layer removed along a (1120) crystal plane.

In a preferred embodiment of the present disclosure, the source gases comprise one or more of $SiH_4$, TCS, $C_3H_8$, $C_2H_4$, etc.

In a preferred embodiment of the present disclosure, a growth temperature of an epitaxial layer of the epitaxial 4H—SiC substrate is 1500-1700° C., and a growth pressure is 80-150 mbar.

In a preferred embodiment of the present disclosure, a flow amount Si/$H_2$ of an Si source and $H_2$ is 0.97‰, a flow amount C/Si of a C source and the Si source is 1.55, the growth speed is about 30 μm/hour, and a step growth height of ½ c.

A step surface model is constructed based on 5×5×3 primitive cells of the 4H—SiC. The 4H—SiC with a flat Si polar surface is obtained by cutting along a vertical direction of a (0001) crystal surface at an interface of a selected biatomic layer. A C—Si biatomic layer on an uppermost layer on a right side is then removed along a direction of the (1120) crystal plane, and the step model of the 4H—SiC is finally obtained. C—Si biatomic layers in crystals of the 4H—SiC are stacked with a sequence of . . . ABCBABCB . . . . When the step height is ¼ c, four step structures may exist, and the stackings are respectively ABCB, BCBA, CBAB, and BABC from inside to outside and respectively named S1, S2, S3, and S4. Referring to FIG. 1, each of S1, S2, S3, and S4 consists of a 5×5×1 atomic thin layer and a vacuum layer, wherein four pairs of the C—Si biatomic layers are included, the vacuum layer of 20 Å is retained in a c-axis direction to eliminate interaction of superficial atoms of upper and lower layers, and periodic extension is performed along a-axis and b-axis directions. Dangling bonds of C atoms at a bottom of the four step structures are passivated by H atoms, and atoms in the whole step structure can be optimized by relaxation along the c-axis direction. In calculation, 400 eV is taken as a cut-off energy of a plane wave, and grid points are set to be 8×8×8.

According to simulation calculations, referring to FIG. 2, a variation trend of formation power of growth adsorption structures is plotted following with relative chemical potential. When the epitaxial growth of the 4H—SiC is performed in the C-rich condition, adsorbed units participating in growth in advance are the SiC molecules, the height of the growth step is ½ c, and the double-step growth mode occurs.

All of three units, Si atoms, the SiC molecules (C atoms are adsorbed in advance), and C—$Si_2$ clusters, can be stably adsorbed at a boundary of double steps according to the simulation results of different growth monomers adsorbed by the double steps. The formation power of the Si atoms and the $Si_2C$ clusters adsorbed on the double steps continually decreases and the stability continually increases with the relative chemical potential of C continually increasing. The stability of the C—$Si_2$ clusters adsorbed on the boundary of the SiC step is the strongest regardless of whether the growth environment is in the Si-rich condition or the C-rich condition, and the formation powers of the C—$Si_2$ clusters adsorbed on two different steps S1' and S3' are basically the same. Therefore, the height of the growth step will be maintained at ½ c, and a better roughness of an epitaxial surface can be obtained.

An equipment for 4H—SiC homogeneous epitaxial growth of the present disclosure is a rotary monolithic hot-wall reactor. The system uses RF heating and effectively controls a temperature gradient on a surface of a 150 mm 4H—SiC substrate to be no more than 10 K/cm, avoiding surface subcooling from being too great and reducing defects introduced by thermal stresses. During the growth process, a rotating base can effectively improve a radial distribution of the source gases on a surface of the 150 mm 4H—SiC substrate to effectively adjust a thickness and doping concentration inhomogeneity. A method for SiC high-speed growth by regulating growth monomers using chemical potential under a non-equilibrium condition comprises the following steps:

The 4H—SiC substrate used for epitaxial growth is the 150 mm 4H—SiC substrate cut from the same ingot of the same manufacturer by biasing 4° to avoid epitaxial results from being affected by a substrate processing technology or crystallization quality. The equipment uses the manipulator to automatically place and take the 150 mm 4H—SiC substrate out at a high temperature, the 150 mm 4H—SiC substrate for epitaxial growth grows in a single furnace and is compatible with a 100 mm 4H—SiC substrate for the epitaxial growth. Typical growth sources are $SiHCl_3$ (TCS) and $C_2H_4$, an N-type doping source is $N_2$, a P-type doping source is TMA1, and hydrogen functions as carrier gas. Spare parts inside the chamber are made of graphite, and the spare parts can be quickly heated up and maintain the temperature of the chamber. A graphite base has an air-float rotation function to enable the 4H—SiC substrate to perform the epitaxial growth in a rotating state. A typical growth temperature of the 4H—SiC substrate is 1650° C.

Preparing the 4H—SiC substrate with the step: RF heating is used, the reaction chamber is heated from room temperature to 900° C. and maintained at a constant temperature after reaching a target temperature. The 4H—SiC substrate planned for growth is then placed into the susceptor using the vacuum pen, the susceptor together with the 4H—SiC substrate are loaded into the reaction chamber by the manipulator, and the temperature of the reaction chamber is maintained at 900° C. at this time. The RF generator heats the reaction chamber according to the preset heating rate. At the same time, the pressure of the reaction chamber gradually decreases to the preset growth pressure. When the temperature inside the reaction chamber reaches 1400° C., the heating speed decreases, and the temperature slowly increases to the preset process temperature (1550-1670° C.). In-situ etching is followed. When the temperature of the reaction chamber reaches the preset process temperature, the 4H—SiC substrate is maintained at the preset process temperature for the in-situ etching for 1-20 minutes. During the etching process, a small amount of the silicon source or the carbon source needs to be introduced to control desorption speeds of the Si atoms and the C atoms from the surface of the 4H—SiC substrate, and the 4H—SiC substrate with the step is finally obtained.

Figure 3:
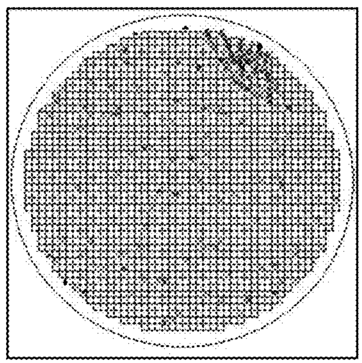
FIG. 3 shows effects on morphology defects and a height of a surface grown step of the 4H—SiC epitaxial surface under a fixed flow amount $Si/H_2$ of the Si source being 0.97‰ and various C source flow amounts.
Figure 3:
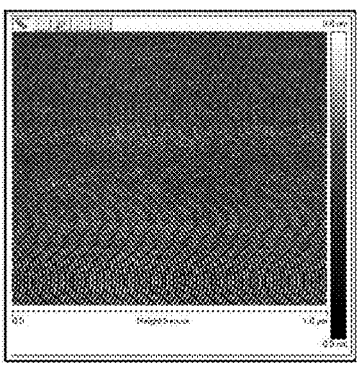
Figure 3:
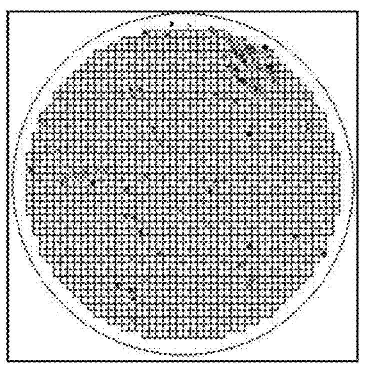
Figure 3:
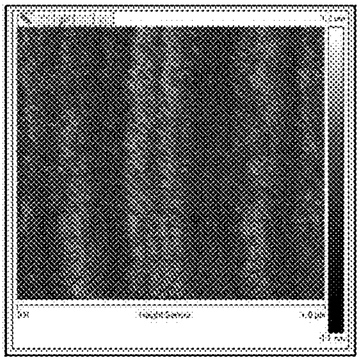
Figure 3:
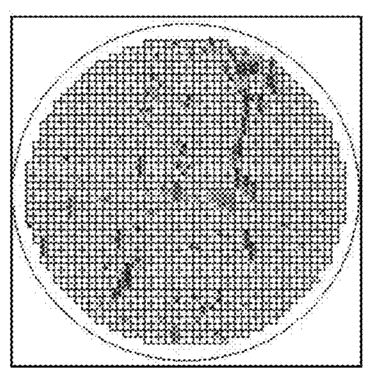
Figure 3:
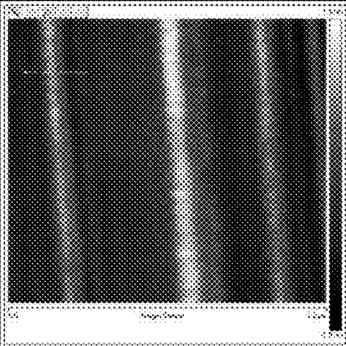

In order to obtain a higher epitaxial growth speed, a flow amount of the Si source is set to be $Si/H_2$=0.97‰, and a flow amount of the C source is set to $C/H_2$=1.21‰, 1.50‰, and 1.70‰ (the C/Si ratio is respectively 1.25, 1.55, and 1.75), and the epitaxial growth speed is ≥25 μm/hour under all of the aforementioned three conditions. Three 150 mm 4H—SiC substrates for sample growth are the same as those used in a low-speed growth experiment, and all from the same ingot of the same manufacturer. Thicknesses of 4H—SiC high-speed epitaxial samples D, E, and F are all about 12 μm, and surface morphology defect detection and surface roughness detection are respectively performed. When atomic force microscopy (AFM) is used for the surface roughness detection, scanning dimensions are 1 μm×1 μm, and the obtained results are shown in FIG. 3. A C/Si ratio of the sample D is 1.25, a number of triangular and carrot dislocations on the epitaxial surface are more, a surface defect density reaches 1.33 $cm^{-2}$, defects are uniformly distributed on the whole sample D, a surface roughness root mean square (RMS) is 0.31 nm, and a height of the growth step of ½ c. The results suggests that when the flow amount of the C source is set to $C/H_2$=1.21‰, the relative chemical potential of the C source is higher, the growth environment is in the C-rich condition during the epitaxial growth, and the step growth is achieved mainly by adsorbing the SiC molecules. The C/Si ratio of the sample E is 1.55, a number of defects on the epitaxial surface is less, and the defect density is 0.59 $cm^{-2}$. The surface roughness RMS is 0.41 nm, the flow amount of the C source enables the growth environment to be in a C-rich condition, the epitaxial growth is achieved mainly by adsorbing the SiC molecules, and the height of the growth step is ½ c. However, the flow amount of the C source is higher and the relative chemical potential of the C source is larger, resulting in a phenomenon of step aggregation (an aggregation height is about 1 nm and a width of an aggregated countertop is about 200-300 nm) occurring on the growth surface. The C/Si ratio of the sample F is 1.75, a number of surface defects obviously increases, the defect density reaches 1.22 $cm^{-2}$, and the surface roughness RMS reaches 0.68 nm. At the same time, the phenomenon of the step aggregation obviously occurs on the surface, a height of the step aggregation reaches 3-4 nm, and a width of a formed countertop is about 150-200 nm.

The aforementioned embodiments are merely some embodiments of the present disclosure, and the scope of the disclosure is not limited thereto. Thus, it is intended that the present disclosure cover any modifications and variations of the presently presented embodiments provided they are made without departing from the structure, the shape, and the principle of the present disclosure.

What is claimed is:

1. A method for SiC step flow growth by regulating growth monomers using chemical potential under a non-equilibrium condition, comprising:

1) preparing a silicon carbide (SiC) substrate, wherein the SiC substrate is a 4H—SiC substrate with a step;
2) heating a reaction chamber to a first temperature, and then maintaining the reaction chamber at the first temperature;
3) placing the 4H—SiC substrate with the step into a susceptor, and then loading the susceptor and the 4H—SiC substrate with the step into the reaction chamber together while maintaining a temperature of the reaction chamber at the first temperature;

4) heating the reaction chamber to a preset process temperature, and reducing a pressure of the reaction chamber to a preset growth pressure at a same time;

5) performing in-situ etching on the 4H—SiC substrate with the step while maintaining at the preset process temperature when the temperature of the reaction chamber reaches the preset process temperature;

6) filling a growth source gas after the in-situ etching is complete, and growing an epitaxial layer under a C-rich condition to obtain an epitaxial substrate, wherein growing the epitaxial layer under the C-rich condition comprises controlling chemical potential $\mu_C$ of C to maintain a height of the step at ½c, and the ½c is half of a crystalline cell height of 4H—SiC; and 7) turning off the growth source gas and cooling after growing of the epitaxial layer is complete, and then taking the susceptor and the epitaxial substrate out of the reaction chamber.

2. The method for the SiC step flow growth by regulating the growth monomers using the chemical potential under the non-equilibrium condition according to claim 1, wherein:

the step 6 comprises:

controlling the chemical potential $\mu_C$ of C, wherein $\mu_C$ is greater than −9.300000 eV, uc is less than $\mu_C^{bulk}$, and the $\mu_C^{bulk}$ is −9.095729 eV.

3. The method for the SiC step flow growth by regulating the growth monomers using the chemical potential under the non-equilibrium condition according to claim 2, wherein: in the step 6, flow amounts of a C source and an Si source are $Si/H_2$=0.97‰ and C/Si=1.55, and a growth speed of 30 μm/hour is achieved in the C-rich condition.

4. The method for the SiC step flow growth by regulating the growth monomers using the chemical potential under the non-equilibrium condition according to claim 1, wherein: in the step 6, a temperature for growing the epitaxial layer is 1500-1700° C., and a growth pressure for growing the epitaxial layer is 80-150 mbar.

5. The method for the SiC step flow growth by regulating the growth monomers using the chemical potential under the non-equilibrium condition according to claim 1, wherein: in the step 6, the growth source gas comprises at least one of $SiH_4$, TCS, $C_3H_8$, or $C_2H_4$.

6. The method for the SiC step flow growth by regulating the growth monomers using the chemical potential under the non-equilibrium condition according to claim 1, wherein: in the step 2, the first temperature is 850-950° C.

7. The method for the SiC step flow growth by regulating the growth monomers using the chemical potential under the non-equilibrium condition according to claim 1, wherein:

the heating the reaction chamber to the preset process temperature in step 4 comprises:

firstly heating to 1400° C. at a speed of 20-30° C./minute, and then heating to the preset process temperature at a speed of 10-15° C./minute.

8. The method for the SiC step flow growth by regulating the growth monomers using the chemical potential under the non-equilibrium condition according to claim 7, wherein the preset process temperature in step 4 is 1550-1670° C.

9. The method for the SiC step flow growth by regulating the growth monomers using the chemical potential under the non-equilibrium condition according to claim 1, wherein:

pure hydrogen or pure hydrogen mixed with the growth source gas is used during the in-situ etching of the step 5, and the in-situ etching is performed for 1-20 minutes.

10. The method for the SiC step flow growth by regulating the growth monomers using the chemical potential under the non-equilibrium condition according to claim 1, wherein the cooling in the step 7 comprises naturally cooling to the first temperature.

11. The method for the SiC step flow growth by regulating the growth monomers using the chemical potential under the non-equilibrium condition according to claim 1, wherein:

the controlling chemical potential $\mu_C$ of C to maintain a height of the step at ½c comprises:

controlling the chemical potential $\mu_C$ of C to vary in a range of from $\Delta H_f^{SiC}+\mu_C^{bulk}$=−9.643384 eV to $\mu_C^{bulk}$=−9.095729 eV, $\mu_C^{bulk}$ is chemical potential of C single-crystal diamond, and $\Delta H_f^{SiC}$ is formation enthalpy of SiC.

12. The method for the SiC step flow growth by regulating the growth monomers using the chemical potential under the non-equilibrium condition according to claim 1, wherein: in the step 6, flow amounts of a C source and an Si source are $Si/H_2$=0.97‰ and C/Si=1.55, and a growth speed of 30 μm/hour is achieved in the C-rich condition.

13. The method for the SiC step flow growth by regulating the growth monomers using the chemical potential under the non-equilibrium condition according to claim 1, wherein the preset process temperature in step 4 is 1550-1670° C.

* * * * *